(12) United States Patent
Sato et al.

(10) Patent No.: US 7,410,601 B2
(45) Date of Patent: Aug. 12, 2008

(54) CONDUCTIVE PASTE FOR MULTILAYER ELECTRONIC PART

(75) Inventors: Minoru Sato, Tokyo (JP); Norihiro Baba, Tokyo (JP)

(73) Assignees: Shoei Chemical Inc., Tokyo (JP); TDK Corporation, Tokyo (JP)

( * ) Notice: Subject to any disclaimer, the term of this patent is extended or adjusted under 35 U.S.C. 154(b) by 0 days.

(21) Appl. No.: 11/853,362

(22) Filed: Sep. 11, 2007

(65) Prior Publication Data

US 2008/0083909 A1    Apr. 10, 2008

(30) Foreign Application Priority Data

Oct. 4, 2006 (JP) ............................. 2006-273252
Jul. 6, 2007 (JP) ............................. 2007-178581

(51) Int. Cl.
*H01B 1/22* (2006.01)

(52) U.S. Cl. ...................... 252/512; 252/514; 106/311

(58) Field of Classification Search ................. 252/512, 252/514; 106/1.18–1.21
See application file for complete search history.

(56) References Cited

U.S. PATENT DOCUMENTS

| 7,053,313 | B2 * | 5/2006 | Hahn et al. ................. 174/256 |
| 2006/0192180 | A1 * | 8/2006 | Ichitani et al. .............. 252/500 |
| 2007/0290369 | A1 * | 12/2007 | Hasegawa et al. ........... 257/783 |

FOREIGN PATENT DOCUMENTS

JP    2003124052    4/2003

* cited by examiner

*Primary Examiner*—Mark Kopec
(74) *Attorney, Agent, or Firm*—Lucas & Mercanti, LLP

(57) ABSTRACT

Disclosed is a conductive paste for a multilayer electronic part to be screen-printed on a ceramic green sheet, comprising 70-95 weight % of conductive metal powder, a resin, and a solvent, wherein a phase angle δ in a dynamic viscoelastic measurement is within a range of from 43° to 72° at a frequency of 0.05 Hz and is within a range of 63° or less at a frequency of 30 Hz.

4 Claims, No Drawings

CONDUCTIVE PASTE FOR MULTILAYER ELECTRONIC PART

BACKGROUND OF THE INVENTION

1. Field of the Invention

The present invention relates to a conductive paste for a multilayer electronic part, and particularly, to a conductive paste which is directly screen-printed on a ceramic green sheet. More particularly, the present invention relates to a conductive paste of high metal content for a multilayer electronic part which is suitable for efficiently forming a conductor circuit, an electrode, a via conductor, and the like, of a multilayer electronic part, such as a multilayered substrate, a multilayer inductor, a multilayer capacitor, and a multilayer actuator. In particular, the present invention relates to a conductive paste for a multilayer electronic part, which paste enables a continuous printing of a high-definition conductor pattern with a high aspect ratio on a low-temperature fired multilayered substrate.

2. Related Art

In recent years, an applied electronic equipment has rapidly been developed, and the requirements of the miniaturization of electronic parts and the change to high-density mounting have increased. Moreover, as for a substrate, on which electronic component is mounted, a multilayer substrate, in which elements such as an inductor and a capacitor are built, has been being developed. Furthermore, a low-temperature fired substrate (low temperature co-fired ceramics (LTCC) substrate) using a ceramic material or a glass-ceramic material, which LTCC substrate can be fired at a low temperature of 1,000° C. or less, is known for performing a co-firing with a conductor material and/or a resistive material, and the LTCC substrate is used as the substrate of a high-frequency superimposing module, an antenna switch module, a band-pass filter, a balun, a coupler, a deplexer, and the like.

The multilayer substrate is manufactured, for example, as follows. An organic binder, a plasticizer, a solvent, a dispersing agent if necessary, and the like, are suitably mixed with a substrate material such as glass powder and ceramic powder, the mixed powder is formed into a sheet to obtain a ceramic green sheet, and if necessary, the ceramic green sheet is drilled to form a via hole. A conductive paste is printed on the green sheet by a screen printing method to form a predetermined conductor pattern, and the conductive paste is filled in the via hole. A plurality of sheets on which the conductive paste pattern has been formed in such a way is laminated on one another and is cut. Subsequently, the cut laminated body is fired, and if necessary, a surface conductor is further formed.

Moreover, a multilayer electric part, such as a multilayer inductor, is manufactured as follows. A through-hole is formed in a ceramic green sheet including a magnetic material powder or a non-magnetic material powder. A coil conductor is formed as an internal electrode by screen-printing a conductive paste in a predetermined pattern. A coil is formed by laminating a predetermined number of the green sheets on which the electrode is formed. The laminated green sheets are cut. The cut green sheets are fired. Then, a terminal electrode is formed.

In both the cases, as for the conductive pastes, the followings are used; at least conductive powder, a vehicle including a resin and an organic solvent, and various additives at request are mixed to be a paste, a paint, or an ink.

As the conductor materials of the conductive pastes in these multilayer parts, metals such as gold, silver, copper, palladium, platinum, nickel, and tungsten have conventionally been used. For the high integration, the miniaturization, and the weight saving of an LTCC substrate, it is important to suppress transmission loss to be low. Accordingly, silver, copper, and alloys containing silver and/or copper, which have low resistance values, are mainly used for an LTCC substrate and a multilayer inductor. Moreover, in order to lower a conductor resistance, it is necessary to form a conductor film with a dence and thick configuration. Therefore, a paste having a large metal powder content, especially the one having a metal powder content in the paste of from about 70 weight % to about 95 weight %, is generally used. The situation is also true in the case of using the conductor film to a via hole conductor. That is, in order to heighten the filling property to a via and to minimize the difference of firing shrinkage between that of the substrate and that of the conductor, which difference causes an interlayer separation and a crack, it is necessary to suppress the firing shrinkage of the conductor. Accordingly, the amount of the resin and the solvent to be burnt off during firing is decreased, and the solid content of the conductive paste is heightened as much as possible.

On the other hand, the screen printing method, which is generally used for forming a conductor pattern on a ceramic green sheet, is an excellent printing technique having high productivity, but it is difficult for the screen printing method correspond to the requirement of the enhancement of accuracy accompanying the densification of the latest electronic equipment. That is, for example, it is required to form a fine pattern in which line width/space is 100 μm/100 μm or less, and it is also required to have a good filling property into the via at the same time. In particular, it is difficult to form a pattern in which the line widths are narrow and the aspect ratio (film thickness/width) thereof is large with high accuracy and high productivity while necessary printed film thickness is secured when the LTCC, and the multilayer inductor, or the like, are manufactured.

Conventionally, mass productive printing on green sheets has been performed by the optimization of a screen printer and a paste, and the property of the screen printing of the paste has been enhanced by controlling a viscosity, a thixotropy index (TI) value, an yield value, and the like, thereof. It is necessary to use a paste having high viscosity, a high TI value, and a high yield value for forming a line pattern having a large aspect ratio by screen printing. However, although a line pattern having a large aspect ratio can be formed by adjusting such factors suitably, it is difficult to control the occurrence of the bleeding of a paste, a low spot, a chip, a shear droop, and the like, of a pattern. And, there is the following problem, that is, when printing is repeated a number of times, these disadvantages arise to deteriorate the accuracy of printing, and to make it impossible to perform continuous printing.

The following matters can be considered to be the causes of the disadvantages such as the bleeding, the low spot, the chip, and the shear droop.

a) When the screen-transmission quantity of a paste is too much, a part of the paste enters the back of a screen printing plate to cause the bleeding.

b) When the screen transmission of a paste is bad, the clogging of the paste to a mesh arises, or the paste adheres to the side wall of a pattern hole of the screen. Consequently, a low spot or a chip arises in the pattern.

c) The paste which is screen-printed on a substrate cannot keep the shape thereof, and the line width thereof is widened. Consequently, a shear droop arises.

Because such disadvantages more remarkably arise as the number of repeating times of printing increases, the disadvantages cause a serious problem in a case where screen printing is continuously performed many times in a mass production line of a multilayered substrate or a multilayer component, and, for example, it is extremely difficult to perform highly accurate screen-printing with repetition of more than 1,000 times. Accordingly, it has conventionally been difficult by the related art to mass-produce, for example, a multilayered substrate or a multilayer component having a conductor pattern with a width of from 25 μm to 60 μm and a high aspect ratio.

Accordingly, for example, it is proposed to form a fine conductor pattern using a photolithographic method (photochemical engraving technique) with a photosensitive electroconductive paste instead of the screen printing method. The photosensitive electroconductive paste contains a conductive metal powder, such as the powder of silver, gold, and copper, a photosensitive resin, a photo initiator, a solvent, and the like. The paste is applied to the whole surface of the substrate. After the paste has dried, an ultraviolet ray is radiated using a photomask to cure the exposed area. Next, the parts of the paste that are not cured in the unexposed areas are removed using a developing solution to form a pattern. However, when a pattern is intended to be formed on a ceramic green sheet using such a photosensitive paste, the organic solvent in the paste permeates the green sheet, and thereby the removal of the paste in the unexposed area becomes very difficult at the time of development, to make it difficult to obtain a pattern with high-definition. Moreover, because the metal powder in the paste disturbs the penetration of the ultraviolet ray into the inner part of the coated film, it is difficult to cure the coated film to the inner part thereof sufficiently, especially when the coated film is thick. Consequently, it is difficult to form a conductor of a thick film thickness.

Japanese Patent Application Laid-Open Publication No. 2003-124052 describes that the problems such as bleeding, clogging, cobwebbing, chipping of a paste by a squeegee, and the like, can be settled by setting the following conditions in a conductive paste containing a conductive metal powder and an organic vehicle which conductive paste is suitable for being printed on a ceramic green sheet to form an internal electrode of a multilayer capacitor, and the like. The conditions are, the viscosity at the shear rate of 500 s$^{-1}$ at the temperature of 25° C. is 1.0-10.0 Pa·s, and the viscosity at the shear rate of 10 s$^{-1}$ is 5.0-20.0 Pa·s. Furthermore, the ratio of a shear storage modulus to a shear loss modulus (tan δ) at a frequency of 1 Hz is within a range of from 2.0 to 8.0. The description is based on the concept that the disadvantages, such as the bleeding and the cobwebbing and the like, at the time of screen printing arise because of the quickness of the structure recovery when the paste is released from the viscosity under a high shear rate at the time of printing and changes to the viscosity under a low shear rate. Further, the concept is that the quickness is influenced by the ratio of a viscous component (shear loss modulus in a dynamic viscoelastic measurement) to an elastic component (shear storage modulus in the dynamic viscoelastic measurement) that constitute the paste. The method disclosed in the description attempts to solve the problems by adjusting the ratio, tan δ, of the shear storage modulus to the shear loss modulus into a specific range at a specific frequency of 1 Hz, based on the concepts.

However, by research of inventors of the present invention, such a method is effective for a paste in which the contained amount of the metal powder is not so large, such as a paste for the internal electrode of a multilayer capacitor, which is required to form an extremely thin conductor film, as the preferable contained amount of the metal powder disclosed in the Japanese Patent Application Laid-Open Publication No. 2003-124052 is within a range of from 40 weight % to 60 weight %. But, the method cannot solve the problem of the continuous printing property in a paste in which the content of the metal powder is high, for example, 70 weight % or more, and which is to be used for forming a conductor film having a comparatively thick film thickness and a low resistance value as described above.

SUMMARY OF THE INVENTION

It is an object of the present invention is to provide a conductive paste for a multilayer electronic part which paste has a large amount of conductive metal powder and enables printing on a ceramic green sheet by the screen printing to have a comparatively thick film thickness and to be continuously performed at a high accuracy.

According to one aspect of the present invention, there is provided a conductive paste for a multilayer electronic part to be screen-printed on a ceramic green sheet, comprising:
70-95 weight % of conductive metal powder;
a resin; and
a solvent, wherein
a phase angle δ in a dynamic viscoelastic measurement is within a range of from 43° to 72° at a frequency of 0.05 Hz and is within a range of 63° or less at a frequency of 30 Hz.

DETAILED DESCRIPTION OF THE PREFERRED EMBODIMENTS

Hereinbelow, an embodiment of a conductive paste for a multilayer electronic part according to the present invention is described. However, the scope of the invention is not limited to the contents of the following description.

In dynamic viscoelastic measurement of observing a response of a paste when a sine vibration is given to the paste, a complex dynamic shear modulus $G^*(\omega)$ defined as a ratio of a stress σ, which sinusoidally varies, to a distortion γ is described by the following expression (1), in which a shear storage modulus is denoted by $G'(\omega)$ and a shear loss modulus is denoted by $G''(\omega)$.

$$G^*(\omega)=\sigma/\Gamma=G'(\omega)+iG''(\omega) \quad (1)$$

The phase angle δ in the complex dynamic shear modulus $G^*(\omega)$ is 0° in a perfect elastic body and 90° in a perfect viscous body and takes an intermediate value in a viscoelastic body. The phase angle δ can also be expressed by a loss tangent tan δ, that is, a ratio of the shear loss modulus to the shear storage modulus (the following expression (2)).

$$\tan \delta = G''(\omega)/G'(\omega) \quad (2)$$

In the present invention, a paste is designed and manufactured so that the phase angle δ may be within the following range when the dynamic viscoelastic property of a conductive paste for a multilayer electronic part (hereinafter also referred to as "a conductive paste" or "a paste") is measured in order to enable forming a line having a thick film thickness and no defects even in the case of being formed by continuous screen printing at high accuracy.

i) phase angle δ at the frequency of 0.05 Hz being within the range of from 43° to 72° ii) phase angle δ at the frequency of 30 Hz being within the range of 63° or less When the phase angle δ is smaller than 43° at 0.05 Hz, bleeding arises by continuous screen printing. The reason is considered as follows: elasticity is too high in comparison with the viscosity thereof; the paste easily passes through the screen mesh; a paste discharging quantity is too large; and consequently the paste enters the back of a printing plate. Moreover, in the case of the paste having the phase angle δ larger than 72° at 0.05 Hz, the film thickness becomes insufficient owing to continuous screen printing, or a low spot of printing or a chip of the pattern arises. The reason is considered as follows: viscosity is too high in comparison with the elasticity thereof; it becomes difficult for the paste to pass through the screen mesh; and consequently the transcript amount to the substrate decreases. It is more preferable that the value of the phase angle δ at 0.05 Hz is within a range of from 43° to 64°. When the phase angle δ exceeds 64° at 0.05 Hz, the discharge quantity of the paste is not stable immediately after a start of continuous printing, and the low spot sometimes arises. Although the problem can be solved by performing trial printings about ten times at the start of the continuous printing, when the phase angle δ is 64° or less, no low spots arise even immediately after a start of continuous printing, and a superior printing property can be obtained.

However, even if the phase angle δ is within a range of from 43° to 72° at the frequency of 0.05 Hz, when the phase angle δ of a paste exceeds 63° at the frequency of 30 Hz, then a printing shear droop arises. The reason can be considered as follows: the viscosity of the paste is too high in comparison with the elasticity thereof, and the paste becomes easy to flow.

In the present invention, the dynamic viscoelasticity of a paste can be measured with a rheometer as follows. The dynamic viscoelasticity of a paste is measured in a linear region of a viscoelastic function of a shear storage modulus $G'(\omega)$, a shear loss modulus $G''(\omega)$, a phase angle δ, or the like, without depending on any stress or any deformation. To put it concretely, a frequency is fixed and a distortion quantity is first changed to obtain a linear region in which the viscoelastic function shows a fixed value. Next, the frequency is changed at a fixed distortion quantity in the linear region to measure the phase angle δ. At this time, when the measurement is performed at a comparatively high value of the distortion quantity in the linear region, the errors caused by the accuracy of the apparatus become smaller, and thus such a measurement is preferable.

The viscoelastic function can be calculated by the frequency sweep obtained by the measurement of the dynamic viscoelasticity of a paste by changing the frequency in the linear region, and the internal structure of the paste composed of a metal powder, a resin, a solvent, and the like, which constitute the paste, can be estimated. However, the screen printing, by which a paste passes through the screen mesh, is a behavior under a large deformation based on a non-linear viscoelastic phenomenon in which the internal structure of the paste greatly changes, and consequently the quantitative analysis thereof is exceedingly difficult. However, the inventors of the present invention minutely examined the relation between the property of the screen printing of a paste, which is a nonlinear behavior, and the phase angle δ of the parameter expressing the internal structure of the paste obtained in the linear region. Consequently, the inventors found that the property of the screen printing in the case where the continuous screen printing of a pattern having a large aspect ratio was performed using a paste containing a conductive metal powder by a large contained amount was able to be presumed on the basis of the phase angles δ at the frequencies of 0.05 Hz and 30 Hz.

The conductive paste of the embodiment of the present invention is prepared by mixing and kneading each material in the usual manner, and by uniformly dispersing a conductive metal powder in a vehicle containing a resin and a solvent. In the present invention, a choice of each material constituting the conductive paste is made and a compound ratio of each of the materials is determined by using the fact that the aforesaid superior continuous printing property can be obtained when the phase angle δ is within the range mentioned above. That is, the conductive paste of the present invention is designed so that the phase angle δ may be within the aforesaid range when dynamic viscoelastic property of a paste obtained by actually kneading each material is measured. The factors affecting the dynamic viscoelastic property include, other than the compound ratio of each paste material, the particle diameters, the surface states, and the agglomeration of the conductive metal powder; the kind and the polymerization degree of a resin; a solubility to a solvent, the viscosity of a resin solution (vehicle), and the like. Consequently, to put it concretely, when a conductive paste is designed, for example, several candidates of materials to be used are actually kneaded to produce pastes, and the candidates are narrowed down to the ones having the phase angles δ in a preferable range or in the vicinity of the range. Then, if necessary, material selection, the fine adjustment of a compound ratio, and the like, are furthermore performed, and thereby the composition of a conductive paste superior in printing property can be determined. Alternatively, a plurality of kinds of pastes variously different from one another in combinations of materials and compounds ratios of these materials are produced in advance, the dynamic viscoelastic properties of these pastes are measured to obtain a large number of pieces of phase angle data. In such a case, the final composition can also be determined on the basis of the data.

One kind, or two or more kinds of metal powders or their alloy powders that are generally used for conductive pastes, such as silver, gold, platinum, copper, palladium, nickel, tungsten, zinc, tin, iron, and cobalt, are used as the conductive metal powder of the paste of the embodiment of the present invention. A composite powder composed of an inorganic powder such as an oxide, glass, and a ceramic, on which a metal is coated, or a composite powder composed of a metal powder, on which surface an oxide, glass, ceramic, or another metal is coated may be used. Moreover, if necessary, the metal powders may be subjected to a surface treatment with an organometallic compound, a surface active agent, fatty acids, and the like. Silver or copper, which has a low resistance value, or an alloy containing the silver or the copper as the main component, such as a silver-copper alloy, a silver-palladium alloy, and a silver-platinum alloy, are preferably used for the inner conductor, the surface conductor, and the conductor for a via of a low-temperature fired substrate. Among them, the metal powder containing silver as the main component thereof is preferable because it can be fired in the air.

The shape of the conductive metal powder is not limited, and the powders having various shapes, such as a sphere, a flake, a grain, and a mixture thereof, can be used. As for the particle diameter, a mean particle diameter may be within a range of from about 0.1 μm to about 10 μm, and the particles having a mean particle diameter within a range of from 0.3 μm to 5 μm are preferable especially for obtaining a good degree of sintering and a good property of the screen printing. Furthermore, the particles having a mean particle diameter within a range of from 0.5 μm to 3 μm are more preferable. Conductive metal ultrafine particles may be contained by a small quantity in order to adjust a conductive property and the degree of sintering.

The compounding rate of the conductive metal powder is 70 weight % to 95 weight % in the paste, preferably 75 weight % to 94 weight %. When the rate of the metal powder is lower than 70 weight %, a conductor that is dense and has a thick film thickness cannot be obtained when the paste is fired. Consequently, a conductor pattern that has a high aspect ratio and low resistance cannot be obtained. Moreover, when the rate of the metal power is higher than 95 weight %, a viscosity suitable for printing cannot be obtained, or the strength of a coated film after printing becomes weak to reduce the adhesion with a substrate.

As the resin, a resin that is generally used for a conductive paste is used individually or in a suitable combination, which resin includes a cellulosic resin, such as ethyl cellulose, hydroxyethyl cellulose, ethylhydroxyethyl cellulose, and nitrocellulose; acrylic resin; methacrylic resin; butyral resin; epoxy resin; phenolic resin; rosin; and the like. The blending quantity of the resin is not especially limited, but about 1-15 weight % in a paste is preferable.

In the embodiment of the present invention, as the resin, it is especially preferable to use ethyl cellulose, which has a good printing property. Furthermore, in order to design a paste so that the phase angle δ at the time of measuring a dynamic viscoelastic property may be in the range of the embodiment of the present invention, it is preferable to use the ethyl cellulose having 0.150-0.385 Pa·s (150-385 centipoises) of viscosity of a resin solution at 25° C. in the case where 5 weight % of a resin is dissolved in a mixed solvent of 80 weight % of toluene and 20 weight % of ethanol (hereinafter referred to "the viscosity of 5% of toluene-ethanol solution").

As such a resin, for example, ethyl cellulose N-200, K-200, T-200 (all of which have 0.150-0.250 Pa·s of the viscosity of 5% of toluene-ethanol solution), ethyl cellulose N-300 (which has 0.250-0.350 Pa·s of the viscosity of 5% of toluene-ethanol solution), which are manufactured by Hercules Incorporated; ETHOCEL STD-200, HE-200 (all of which have 0.180-0.220 Pa·s of the viscosity of 5% of toluene-ethanol solution) and ETHOCEL HE-350 (which has 0.315-0.305 Pa·s of the viscosity of 5% of toluene-ethanol solution), which are manufactured by the Dow Chemical Company; and the like can be cited. When other pieces of ethyl cellulose of different viscosity type are mixed to these pieces of ethyl cellulose in use, the mixed resin may be adopted when the viscosity of 5% of toluene-ethanol solution of the mixed resin is measured to be within a range of from 0.150 Pa·s-0.385 Pa·s. Moreover, even if a piece of ethyl cellulose showing higher viscosity than those of these pieces of ethyl cellulose and a piece of ethyl cellulose showing lower viscosity than those of these pieces of ethyl cellulose are mixed, the mixed resin may be adopted when the viscosity of 5% of toluene-ethanol solution of the mixed resin is within a range of from 0.150 Pa·s-0.385 Pa·s.

By using such specific ethyl cellulose, it becomes easier to design a paste so that the phase angle δ may be in the aforesaid range, and a paste exceedingly superior in continuous printing property can be obtained as a result.

The solvent also has no particular limitation, and water, hydrocarbons, alcohols, ethers, esters, ketones, or glycols solvents, such as toluene, benzene, octanol, decanol, terpineol, terpineol acetate, dihydro terpineol, dihydro terpineol acetate, carbitol, butyl carbitol, cellosolve, butyl cellosolve, butyl carbitol acetate, cellosolve acetate, ethylene glycol diacetate, and propylene glycol diacetate can be cited. The amount of the solvent in a conductive paste is also not limited, and the amount is suitably adjusted according to the property of a conductive powder, the kind of a resin, a printed film thickness, and the like.

A plasticizer, a dispersing agent, a surface active agent, and the like, may suitably be blended to a conductive paste of the embodiment of the present invention if necessary. Moreover, various inorganic powders and organometallic compounds may be blended for the purpose of the control of a sintering behavior and the like. For example, in order to accelerate a sintering, an inorganic binder, such as a glass frit and a metal oxide, and an organometallic compound as a precursor, which can produce these materials during a sintering, are blended. Moreover, in order to hinder a sintering, or to adjust a firing shrinkage ratio, an inorganic powder, such as a metal oxide powder, a ceramic powder, for example, a ceramic powder containing the same kind of material as that of a substrate, a glass ceramic powder, and a metal oxide powder, and their precursor compounds are blended.

The ceramic green sheet to which a paste of the preferred embodiment of the present invention is applied is not especially limited, and a ceramic green sheet produced as follows are used. That is, a ceramic powder, a glass ceramic powder, a glass powder, and the like, of a dielectric, an insulator, a magnetic material, a piezoelectric material, and the like, which are materials constituting a multilayer electronic part, such as a multilayered substrate, a multilayer inductor, a multilayer capacitor, and a multilayer actuator, are mixed with a resin binder, a plasticizer, a solvent, a dispersing agent if necessary, and the like. Then, the mixture is formed into a sheet, and a via hole is formed if necessary. In particular, a silver-based conductive paste of the embodiment of the present invention is preferably used for forming a conductor circuit and a via conductor of a glass ceramic multilayered substrate, which is fired at a low temperature of 1,000° C. or less, a multilayer inductor, and a low-temperature fired multilayer substrate in which elements such as inductor and capacitor are built therein.

EXAMPLES

Next, the preferred embodiment of the present invention is concretely described on the basis of examples. Incidentally, particle diameters of silver powders in examples and comparative examples are particle diameters calculated from specific surface areas measured by the BET method.

Example 1

As a conductive metal powder, 89.0 parts by weight of silver powder a having a spherelike shape of a particle diameter of 1.79 μm was mixed with 11.0 parts by weight of vehicle of a butyl carbitol solution containing 12% of ethyl cellulose A, which vehicle had a viscosity of 30 Pa·s. The mixture was kneaded with a triple-roll mill to produce a conductive paste. Incidentally, the ethyl cellulose A was N-200 manufactured by Hercules Incorporated, the viscosity of 5% of toluene-ethanol solution (standard value) of which was from about 0.150 Pa·s to about 0.250 Pa·s. Moreover, the viscosity of the vehicle was measured at 25° C. at a shear rate of 4 $s^{-1}$ with a rotational viscometer manufactured by Brookfield Engineering Laboratories, Inc.

All of the rheologic properties of the obtained conductive paste were measured at 25° C. with a commercially available rheometer (AR 1000 manufactured by TA instruments). That is, the dynamic viscoelastic measurement was performed by changing a frequency within a previously obtained linear region in a dynamic viscoelastic measurement mode. The phase angles δ at frequencies of 0.05 Hz, 1 Hz, and 30 Hz were 49.1°, 64.3°, and 51.9°, respectively. Moreover, as a yield value, the stress produced by the flow of the paste was measured by gradually increasing a minute stress to be given to the paste left at rest in a steady flow viscosity measuring mode, and the result of the measurement was 4.4 Pa. Furthermore, the viscosity at the shear rate of 0.4 $s^{-1}$, 4 $s^{-1}$, and 40 $s^{-1}$ was measured at 25° C. with the rotational viscometer manufactured by Brookfield Engineering Laboratories, Inc., and the measurement results were 650 Pa·s, 245 Pa·s, and 84 Pa·s, respectively. The viscosity at the shear rate of 500 s$^{-1}$ measured with the rheometer was 20 Pa·s at 25° C.

The property of the continuous screen printing of the conductive paste was examined, and an exceedingly successful result was obtained, which is, even if continuous printing was performed 1,000 times or more, none of bleeding, low spot or chip, and shear droop was caused.

Incidentally, the property of the continuous screen printing was examined as follows. The conductive paste was screen-printed on a ceramic green sheet continuously by 1,000 times on the conditions that the printing pressure was 2.0-3.0 Kg/cm$^2$, the distance between screen to sheet was 0.5 mm, and the printing speed was 50 mm/s by means of a stainless steel screen of 500 meshes, 25 μm in total thickness, and 12 μm in emulsion thickness, using 2001 TVC manufactured by Micro Tec as a printer. The line width of the printing pattern was 35 μm, and the thickness was adjusted so that the fired film thickness might be within a range of from 10 μm to 12 μm. As the ceramic green sheet, the one obtained by applying a slurry containing an inorganic powder composed of 30 weight % of alumina powder and 70 weight % of glass powder, a resin, and a solvent on a film by the Doctor Blade method and by drying the applied slurry was used. The surface of the printed pattern was observed with eyes and with a stereoscopic microscope immediately after printing and after drying the printed pattern for five minutes at 120° C., and the size of the printed pattern was measured. The printing property was evaluated on the basis of the following criteria.

[Bleeding] The case where there is a part thicker than the plate making size by 4 μm or more immediately after printing.

[Low spot] The case where there is a part chipped from the plate making size by 3 μm or more immediately after printing.

[Shear droop] The case where there is a part where the pattern is thicker than the plate making size of 4 μm or less immediately after printing but is thicker than the plate making size by 4 μm or more after being dried up.

When these disadvantages were not caused even if the number of continuous printing exceeded 1,000 times, the conductive paste was evaluated as "Successful."

Examples 2-12, Comparative Examples 1-6

Nine types of sphere-shaped silver powders having different particle diameters (b1-b2, c1-c3, d, e, f) were used as conductive metal powders. Moreover, five types of butyl carbitol solutions of ethyl cellulose were used as vehicles. Each material was mixed by the blending shown in Table 1 and Table 2, and was kneaded with a triple roll mill to produce conductive pastes.

Incidentally, the particle diameters of the silver powders were as follows.

b1: 0.65 μm, b2: 0.71 μm
c1: 1.10 μm, c2: 1.14 μm, c3: 1.08 μm
d: 0.82 μm
e: 0.48 μm
f: 3.00 μm

Moreover, ethyl cellulose B-E were as follows: B: N-300 manufactured by Hercules Incorporated (0.250-0.350 Pa·s of the viscosity of 5% of toluene-ethanol solution), C: N-100 manufactured by the same company (0.080-0.105 Pa·s of the viscosity of 5% of toluene-ethanol solution), D: N-50 manufactured by the same company (0.040-0.052 Pa·s of the viscosity of 5% of toluene-ethanol solution), E: N-4 manufactured by the same company (0.003-0.0055 Pa·s of the viscosity of 5% of toluene-ethanol solution). Incidentally, Examples 7 used resin B and resin D at the weight ratio of 7:3, and the viscosity of 5% of toluene-ethanol solution of the mixed resin was 170 Pa·s.

In the same manner as Example 1, the rheologic properties of the conductive pastes and the property of the continuous screen printing were examined, and the results are also shown in Table 1 and Table 2. Incidentally, the Example 8 and the Comparative Example 5, in both of which phase angles δ at 0.05 Hz exceed 64° and is less than 72°, caused no low spots even after continuous printing was performed by 1,000 times or more, but caused low spots during a period immediately after the startings of the continuous printing until about tenth time thereof.

In the preferred embodiment, it is an object to provide a conductive paste for a multilayer electronic part which paste contains large amount of conductive metal powder and enables printing on a ceramic green sheet by the screen printing to have a comparatively thick film thickness and to be continuously performed at a high accuracy. Further, in the preferred embodiment, it is an object to provide a conductive paste for a multilayer electronic part which paste enables the mass production of a multilayered substrate or a multilayer component that has a film thickness necessary for obtaining a low resistance conductor film and, also has a fine line pattern of high aspect ratio (ratio of a film thickness to a width), and which paste enables sure via filling.

The inventors performed the dynamic viscoelastic measurement of a paste by giving sine vibrations to the paste to observe the responses of the paste. Then, the inventors evaluated the printing property of the paste. As the result of the evaluation, the inventors found that there was a correlation between a phase angle δ in a shear complex modulus $G^*(\omega)$ at a specific frequency and the occurrence of a bleeding, a low spot, a chip, and a shear droop at the time of continuous screen printing in a conductive paste containing conductive metal powder at a high content. Furthermore, the inventors found that the conductive paste which did not produce these disadvantages was able to be obtained by designing the phase angle δ at the frequency to be in a specific range and accomplished the preferred embodiment of the present invention.

According to one aspect of the preferred embodiment of the present invention, there is provided a conductive paste for a multilayer electronic part to be screen-printed on a ceramic green sheet, comprising: 70-95 weight % of conductive metal powder; a resin; and a solvent, wherein a phase angle δ in a dynamic viscoelastic measurement is within a range of from 43° to 72° at a frequency of 0.05 Hz and is within a range of 63° or less at a frequency of 30 Hz.

Preferably, the resin contains such ethyl cellulose that a viscosity of a solution in which the ethyl cellulose is dissolved by 5 weight % into a mixed solvent of 80 weight % of toluene and 20 weight % of ethanol is 0.150-0.385 Pa·s at 25° C.

Preferably, the phase angle δ is within a range of from 43° to 64° at a frequency of 0.05 Hz.

The conductive paste of the preferred embodiment of the present invention designed as mentioned above contains the conductive metal powder at a high content, and the occurrence of the defects, such as the bleeding, the low spot, the chip, and the shear droop, is exceedingly few even if the screen printing is continuously performed on the ceramic green sheet. Consequently, at the time of mass-producing multilayer electronic parts, continuous printing can be performed without reducing the printing accuracy thereof, and continuous screen printing more than 1,000 times can also be performed. Accordingly, the pattern having a thick film thickness and a large aspect ratio, that is, the pattern with high-definition and low resistance, can be manufactured at a good mass production property. For example, a fine pitch conductor pattern having a line width after firing within a range of from 25 μm to 60 μm and a high aspect ratio of 0.3 or more, which has conventionally been difficult to be performed by continuous printing, can easily be mass-produced. Furthermore, the conductor pattern is also exceedingly excellent in the filling property to a via hole, and, for example, the filling into a via having a diameter of 200 μm or more and a depth of 40 μm or more is also easy.

The entire disclosure of Japanese Patent Application No. 2007-178581 filed on Jul. 6, 2007, and Japanese Patent Application No. 2006-273252 filed on Oct. 4, 2006, including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

TABLE 1

| | SILVER POWDER | | VEHICLE | | | |
|---|---|---|---|---|---|---|
| | TYPE | BLENDING QUANTITY (WEIGHT %) | VISCOSITY (Pa·s) | TYPE OF RESIN | RESIN QUANTITY (WEIGHT %) | SOLVENT QUANTITY (WEIGHT %) |
| EXAMPLE 1 | a | 89.0 | 30 | A | 1.4 | 9.6 |
| EXAMPLE 2 | b1 | 89.0 | 30 | A | 1.4 | 9.6 |
| EXAMPLE 3 | b2 | 89.0 | 30 | A | 1.4 | 9.6 |
| EXAMPLE 4 | b2 | 79.0 | 30 | A | 2.5 | 18.5 |
| EXAMPLE 5 | c1 | 89.0 | 30 | A | 1.4 | 9.6 |
| EXAMPLE 6 | c2 | 88.0 | 30 | A | 1.8 | 10.2 |
| EXAMPLE 7 | c2 | 89.0 | 10 | B | 1.0 | 9.6 |
| | | | | D | 0.4 | |
| EXAMPLE 8 | c3 | 89.0 | 30 | A | 1.4 | 9.6 |
| EXAMPLE 9 | c3 | 87.0 | 46 | B | 1.6 | 11.4 |
| EXAMPLE 10 | a | 88.5 | 46 | B | 1.4 | 10.1 |
| EXAMPLE 11 | f | 91.0 | 30 | A | 1.1 | 7.9 |
| EXAMPLE 12 | a | 94.0 | 19 | A | 0.7 | 5.3 |
| COMPARATIVE EXAMPLE 1 | b1 | 89.0 | 15 | C | 1.4 | 9.6 |
| COMPARATIVE EXAMPLE 2 | b2 | 89.0 | 10 | D | 1.4 | 9.6 |
| COMPARATIVE EXAMPLE 3 | b2 | 89.0 | 15 | C | 1.4 | 9.6 |
| COMPARATIVE EXAMPLE 4 | d | 81.5 | 30 | A | 1.8 | 16.7 |
| COMPARATIVE EXAMPLE 5 | d | 81.0 | 10 | E | 3.8 | 15.2 |
| COMPARATIVE EXAMPLE 6 | e | 86.5 | 10 | D | 1.8 | 11.7 |

TABLE 2

| | VISCOSITY (Pa·s) | | | YIELD VALUE | PHASE ANGLE δ(°) | | | EVALUATION OF CONTINUOUS |
|---|---|---|---|---|---|---|---|---|
| | $0.4\,s^{-1}$ | $4\,s^{-1}$ | $40\,s^{-1}$ | (Pa) | 0.05 Hz | 1 Hz | 30 Hz | PRINTING PROPERTY |
| EXAMPLE 1 | 650 | 245 | 84 | 4.4 | 49.1 | 64.3 | 51.9 | SUCCESSFUL |
| EXAMPLE 2 | 990 | 355 | >100 | 15.0 | 43.9 | 60.5 | 48.0 | SUCCESSFUL |
| EXAMPLE 3 | 920 | 333 | >100 | 26.6 | 45.0 | 60.5 | 47.8 | SUCCESSFUL |
| EXAMPLE 4 | 710 | 160 | 39 | 2.5 | 43.5 | 56.9 | 54.0 | SUCCESSFUL |
| EXAMPLE 5 | 710 | 281 | >100 | 20.0 | 61.6 | 71.8 | 56.8 | SUCCESSFUL |
| EXAMPLE 6 | 440 | 204 | 84 | 8.0 | 63.5 | 70.8 | 57.1 | SUCCESSFUL |
| EXAMPLE 7 | 710 | 276 | >100 | 18.6 | 59.9 | 70.8 | 63.0 | SUCCESSFUL |
| EXAMPLE 8 | 630 | 227 | >100 | 14.0 | 64.5 | 72.5 | 57.6 | SUCCESSFUL |
| EXAMPLE 9 | 680 | 286 | >100 | 18.5 | 63.9 | 67.9 | 55.9 | SUCCESSFUL |
| EXAMPLE 10 | 760 | 309 | >100 | 6.3 | 54.3 | 65.7 | 50.9 | SUCCESSFUL |
| EXAMPLE 11 | 1050 | 435 | >100 | 19.7 | 51.3 | 66.1 | 52.3 | SUCCESSFUL |
| EXAMPLE 12 | 1680 | 499 | >100 | 133.0 | 56.3 | 72.2 | 62.4 | SUCCESSFUL |
| COMPARATIVE EXAMPLE 1 | 920 | 338 | >100 | 17.3 | 42.0 | 62.2 | 53.6 | BLEEDING |
| COMPARATIVE EXAMPLE 2 | 520 | 176 | 74 | 11.3 | 33.6 | 56.5 | 57.0 | BLEEDING |
| COMPARATIVE EXAMPLE 3 | 930 | 273 | 83 | 24.7 | 34.0 | 54.1 | 50.5 | BLEEDING |
| COMPARATIVE EXAMPLE 4 | 160 | 95 | 43 | 0.6 | 57.5 | 74.7 | 65.5 | SHEAR DROOP |
| COMPARATIVE EXAMPLE 5 | 220 | 63 | 24 | 12.1 | 65.1 | 66.3 | 69.1 | SHEAR DROOP |
| COMPARATIVE EXAMPLE 6 | 400 | 102 | 38 | 74.5 | 73.1 | 68.5 | 63.8 | LOW SPOT |

What is claimed is:

1. A conductive paste for a multilayer electronic part to be screen-printed on a ceramic green sheet, comprising:
   70-95 weight % of conductive metal powder;
   a resin; and
   a solvent, wherein
   a phase angle $\delta$ in a dynamic viscoelastic measurement is within a range of from 43° to 72° at a frequency of 0.05 Hz and is within a range of 63° or less at a frequency of 30 Hz.

2. The conductive paste for the multilayer electronic part according to claim 1, wherein the resin contains such ethyl cellulose that a viscosity of a solution in which the ethyl cellulose is dissolved by 5 weight % into a mixed solvent of 80 weight % of toluene and 20 weight % of ethanol is 0.150-0.385 Pa·s at 25° C.

3. The conductive paste for the multilayer electronic part according to claim 2, wherein the phase angle $\delta$ is within a range of from 43° to 64° at a frequency of 0.05 Hz.

4. The conductive paste for the multilayer electronic part according to claim 1, wherein the phase angle $\delta$ is within a range of from 43° to 64° at a frequency of 0.05 Hz.

* * * * *